United States Patent
Oh et al.

(10) Patent No.: US 11,515,615 B2
(45) Date of Patent: Nov. 29, 2022

(54) DISPLAY APPARATUS AND ANTENNA ASSEMBLY

(71) Applicant: SAMSUNG ELECTRONICS CO., LTD., Suwon-si (KR)

(72) Inventors: Sanggi Oh, Suwon-si (KR); Sangho Hong, Suwon-si (KR); Hyungyong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 349 days.

(21) Appl. No.: 16/957,585

(22) PCT Filed: Dec. 19, 2018

(86) PCT No.: PCT/KR2018/016251
§ 371 (c)(1),
(2) Date: Jun. 24, 2020

(87) PCT Pub. No.: WO2019/135517
PCT Pub. Date: Jul. 11, 2019

(65) Prior Publication Data
US 2020/0335850 A1    Oct. 22, 2020

(30) Foreign Application Priority Data

Jan. 3, 2018    (KR) .................... 10-2018-0000953

(51) Int. Cl.
*H01Q 1/22*    (2006.01)
*G02F 1/13*    (2006.01)
(Continued)

(52) U.S. Cl.
CPC ......... *H01Q 1/2258* (2013.01); *G02F 1/1306* (2013.01); *H01Q 1/38* (2013.01); *H01Q 1/422* (2013.01)

(58) Field of Classification Search
CPC ... H01Q 1/22; H01Q 1/38; H01Q 1/42; G02F 1/1306
See application file for complete search history.

(56) References Cited

U.S. PATENT DOCUMENTS

2007/0004253 A1    1/2007    Lee et al.
2007/0242165 A1    10/2007   Naito et al.
(Continued)

FOREIGN PATENT DOCUMENTS

CN    101217852 A    7/2008
CN    201374380 Y    12/2009
(Continued)

OTHER PUBLICATIONS

Communication dated Sep. 2, 2021 issued by the European Intellectual Property Office in counterpart European Application No. 18 898 891.9.
(Continued)

*Primary Examiner* — Andrea Lindgren Baltzell
(74) *Attorney, Agent, or Firm* — Sughrue Mion, PLLC

(57) ABSTRACT

A display apparatus and an antenna assembly are provided. The display apparatus includes: a display; a first circuit board including at least one electronic part configured to process an image signal for displaying an image on the display; a second circuit board including at least one antenna configured to transmit and receive a radio frequency (RF) signal for communication between the display apparatus and an external apparatus; and a spacer provided between the first circuit board and the second circuit board, and configured to space the first circuit board and the second circuit board apart from each other. Thus, radiation performance in the antenna is improved with easy design based on the structure of the display apparatus. Thus, radiation perfor-
(Continued)

mance in the antenna is improved with easy design based on the structure of the display apparatus.

15 Claims, 10 Drawing Sheets

(51) Int. Cl.
*H01Q 1/38* (2006.01)
*H01Q 1/42* (2006.01)

(56) References Cited

U.S. PATENT DOCUMENTS

| | | | |
|---|---|---|---|
| 2008/0143611 | A1 | 6/2008 | Wang |
| 2008/0158470 | A1* | 7/2008 | Chung ............... G02F 1/13452 361/749 |
| 2010/0259881 | A1 | 10/2010 | Choi et al. |
| 2010/0321325 | A1* | 12/2010 | Springer ............. H01Q 1/2266 345/173 |
| 2013/0016484 | A1 | 1/2013 | Yoo |
| 2013/0257659 | A1 | 10/2013 | Darnell et al. |
| 2013/0316664 | A1 | 11/2013 | Kim et al. |
| 2015/0313003 | A1 | 10/2015 | Kasar |

FOREIGN PATENT DOCUMENTS

| | | |
|---|---|---|
| CN | 204720550 U | 10/2015 |
| KR | 10-0609061 B1 | 8/2006 |
| KR | 10-1194981 B1 | 10/2012 |
| KR | 10-2013-0008924 A | 1/2013 |
| KR | 10-1250652 B1 | 4/2013 |
| KR | 10-1253140 B1 | 4/2013 |
| KR | 10-2013-0132058 A | 12/2013 |
| KR | 10-1562813 B1 | 10/2015 |
| KR | 10-2016-0069484 A | 6/2016 |
| KR | 10-2016-0136025 A | 11/2016 |
| KR | 10-2016-0144156 A | 12/2016 |

OTHER PUBLICATIONS

Communication dated Dec. 25, 2020, from the State Intellectual Property Office of People's Republic of China in counterpart Application No. 201880085004.0.
Communication dated Nov. 9, 2020, from the European Patent Office in counterpart European Application No. 18898891.9.
International Search Report dated Apr. 19, 2019 issued by the International Searching Authority in International Application No. PCT/KR2018/016251 (PCT/ISA/210).
Communication dated May 13, 2022 by the Korean Intellectual Property Office for Korean Patent Application No. 10-2018-0000953.

* cited by examiner

| Antenna 1 Efficiency | Antenna 2 Efficiency | Isolation |
|---|---|---|
| 58.2% | 61.8% | -4.8dB |

| Antenna 1 Efficiency | Antenna 2 Efficiency | Isolation |
|---|---|---|
| 70.8% | 69.1% | -6.1dB |

DISPLAY APPARATUS AND ANTENNA ASSEMBLY

TECHNICAL FIELD

The disclosure relates to a display apparatus and an antenna assembly, and more particularly to a display apparatus and an antenna assembly which include an antenna and a communication module to transmit and receive a radio frequency (RF) signal.

BACKGROUND ART

A display apparatus such as a television (TV) supports Wi-Fi and the like wireless communication function.

Components for the wireless communication include an antenna for transmitting and receiving a signal and a communication module for processing the signal, in which the antenna may be provided as a single module combined to the communication module or as a plurality of modules separated from the communication module in the display apparatus.

The antenna is generally designed to be placed outside the display apparatus to secure its radiation performance, and connected to the separated communication module or a main board by a cable.

However, in such a case where the antenna is separately placed outside the apparatus, productivity is lowered in a manufacturing process, and it is hard to avoid deterioration in performance because of a cable connection structure's own loss.

Further, there is concern about restriction on manufacturing the antenna and the communication module into the single module because of the display apparatus's own design and structure, and the deterioration in performance is unavoidable when the antenna is designed to be placed inside the display apparatus.

DISCLOSURE

Technical Problem

The disclosure is conceived to solve the above-described problems, and the disclosure provides a display apparatus and an antenna assembly, in which radiation performance of an antenna is secured and there is no restriction on a design and structure in a manufacturing process.

Technical Solution

According to an embodiment of the disclosure, a display apparatus includes: a display; a first circuit board including at least one electronic part configured to process an image signal for displaying an image on the display; a second circuit board including at least one antenna configured to transmit and receive a radio frequency (RF) signal for communication between the display apparatus and an external apparatus; and a spacer provided between the first circuit board and the second circuit board, and configured to space the first circuit board and the second circuit board apart from each other. Thus, radiation performance in the antenna is improved with easy design based on the structure of the display apparatus.

The display apparatus may further include a communication module provided in the second circuit board and configured to process the RF signal. Thus, the MOB-type second circuit board mounted with the antenna and the communication module is coupled to the first circuit board as being spaced apart from the first circuit board, thereby enhancing efficiencies on a manufacturing process.

The display apparatus may further include a chassis provided in a back of the display, wherein the first circuit board is fastened to the chassis, with a surface, which is opposite to a surface provided with the second circuit board, facing toward the chassis.

The spacer may include: a housing including an insulator and configured to support facing surfaces of the first circuit board and the second circuit board; and a plurality of signal transmission pins. The second circuit board may be detachably provided in the first circuit board by the spacer, the plurality of signal transmission pins may be exposed to a first side of the housing and a second side opposite to the first side, and the exposed portions of the plurality of signal transmission pins may be coupled to both the first circuit board and the second circuit board based on the second circuit board being mounted to the first circuit board. Thus, both the structure support and the electric connection are achieved by a simple coupling part, i.e. the spacer.

The first circuit board may include an edge region disposed downward when the display apparatus is in an installed state, and the second circuit board is provided in the edge region of the first circuit board. Thus, the antenna is placed downward in the display apparatus, thereby having a structure suitable for improving the radiation performance.

The antenna may be provided in a first surface of the second circuit board, and a second surface of the second circuit board opposite to the first surface may at least partially face toward the first circuit board with the spacer therebetween. The antenna may be provided on a region of the first surface opposite to a region of the second surface of the second circuit board which is not facing the first circuit board.

According to an embodiment of the disclosure, an antenna assembly of a display apparatus, include: a sub board including at least one antenna configured to transmit and receive a radio frequency (RF) signal for communication between the display apparatus and an external apparatus; and a spacer provided between a main board provided with at least one electronic part to process an image signal for displaying an image on the display apparatus and the sub board, and configured to space the main board and the sub board apart from each other. Thus, radiation performance in the antenna is improved with easy design based on the structure of the display apparatus.

The antenna assembly may further include a communication module provided in the sub board and configured to process the RF signal. Thus, the MOB-type second circuit board mounted with the antenna and the communication module is coupled to the first circuit board as being spaced apart from the first circuit board, thereby enhancing efficiencies on a manufacturing process.

The spacer may includes: a housing including an insulator and configured to support facing surfaces of the main board and the sub board; and a plurality of signal transmission pins provided in the housing and configured to transmit a signal between the main board and the sub board. Thus, both the structure support and the electric connection are achieved by a simple coupling part, i.e. the spacer.

The sub board may be detachably provided in the first circuit board by the spacer, the plurality of signal transmission pins may be exposed to a first side of the housing and a second side opposite to the first side, and the exposed portions of the plurality of signal transmission pins may be coupled to both the main board and the sub board based on the sub board being mounted to the main board.

The main board may include an edge region disposed downward when the display apparatus is in an installed state, and the sub board is provided in the edge region of the main board. Thus, the antenna is placed downward in the display apparatus, thereby having a structure suitable for improving the radiation performance.

The antenna is provided in a first surface of the sub board, and a second surface of the second circuit board opposite to the first surface at least partially faces toward the first circuit board with the spacer therebetween. The antenna is provided on a region of the first surface opposite to a region of the second surface of the second circuit board which is not facing the first circuit board.

Advantageous Effects

As described above, the display apparatus and the antenna assembly according to the disclosure have effects on improving radiation performance in the antenna with easy design based on the structure of the display apparatus.

BEST MODE

Figure 1:
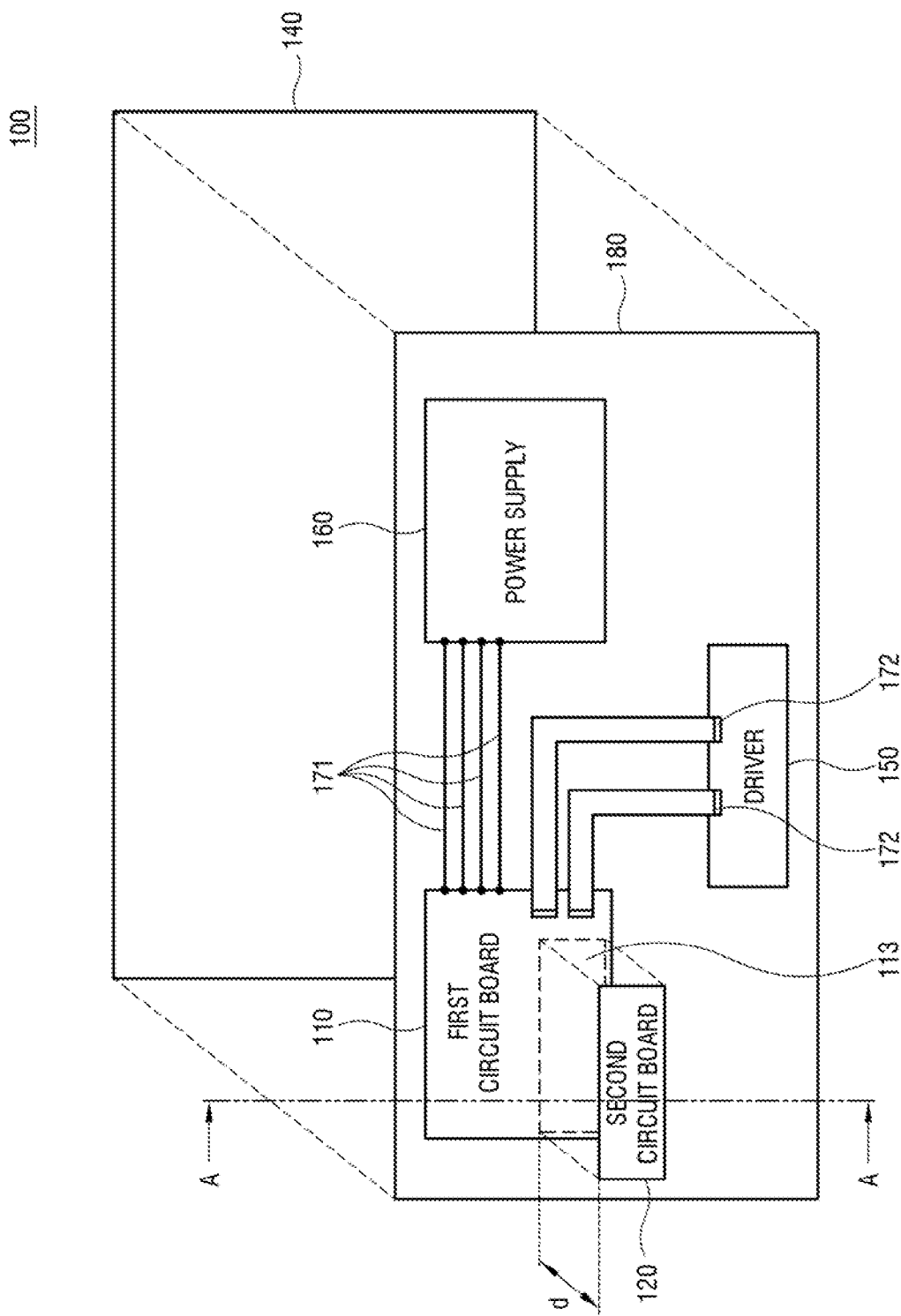
FIG. 1 schematically illustrates a display apparatus according to an embodiment of the disclosure.

Below, exemplary embodiments will be described in detail with reference to accompanying drawings. In the drawings, like numerals or symbols refer to like elements having substantially the same function, and the size of each element may be exaggerated for clarity and convenience of description. However, the configurations and functions illustrated in the following exemplary embodiments are not construed as limiting the present inventive concept and the key configurations and functions. In the following descriptions, details about publicly known functions or features will be omitted if it is determined that they cloud the gist of the present inventive concept.

In the following exemplary embodiments, terms 'first', 'second', etc. are only used to distinguish one element from another, and singular forms are intended to include plural forms unless otherwise mentioned contextually. In the following exemplary embodiments, it will be understood that terms 'comprise', 'include', 'have', etc. do not preclude the presence or addition of one or more other features, numbers, steps, operations, elements, components or combination thereof. In addition, a 'module' or a 'portion' may perform at least one function or operation, be achieved by hardware, software or combination of hardware and software, and be integrated into at least one module. In the disclosure, at least one among a plurality of elements refers to not only all the plurality of elements but also both each one of the plurality of elements excluding the other elements and a combination thereof.

Figure 2:
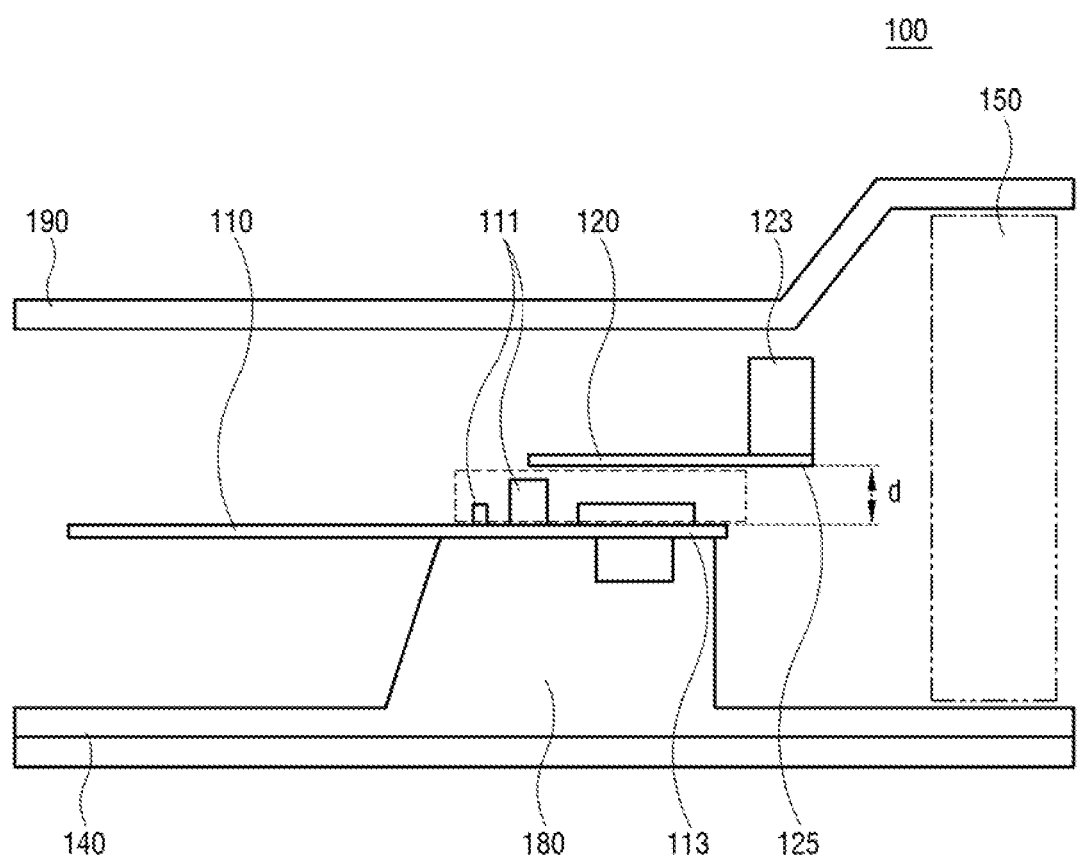
FIG. 2 illustrates a cross-section of the display apparatus of FIG. 1, taken along line A-A.

FIG. 1 schematically illustrates a display apparatus according to an embodiment of the disclosure, and FIG. 2 illustrates a cross-section of the display apparatus of FIG. 1, taken along line A-A.

FIG. 1 illustrates a back of a display apparatus 100 according to an exemplary embodiment, in which a cover member 190 is removed to expose internal components thereof. Therefore, the internal components of the display apparatus 100 are not limited to the embodiment of FIG. 1, but may be variously achieved differently from those of FIG. 1.

The display apparatus 100 processes an image signal, which is received from an external image source (not shown), with a preset image processing process, and displays an image. According to an embodiment, the display apparatus 100 may be embodied by a television (TV) that processes a broadcast image based on a broadcast signal/broadcast information/broadcast data received from a transmitter of a broadcasting station. The broadcast signal received in the display apparatus 100 may be received through a terrestrial wave, a cable, a satellite, etc., and an image source in this embodiment is not limited to the broadcasting station.

Further, the display apparatus 100 may receive an image signal from various external apparatuses (not shown), for example, a smart phone, a tablet computer and the like smart pad, a mobile device including various media players, a personal computer including a desktop or laptop computer, etc. Further, the display apparatus 100 may process a signal to be displayed on a screen as a moving image, a still image, an application, an on-screen display (OSD), a user interface (UI) for controlling various operations, etc. based on a signal/data stored in an internal/external storage medium.

According to an embodiment, the display apparatus 100 may be embodied by a smart TV or an Internet protocol (IP) TV. The smart TV refers to a TV that can receive and display a broadcast signal in real time, support a web browsing function so that various pieces of content can be searched and consumed through the Internet while a broadcast signal is displayed in real time, and provide a convenient user environment for the web browsing function. Further, the smart TV includes an open software platform to provide an interactive service to a user. Therefore, the smart TV is capable of providing various pieces of content, for example, an application for a predetermined service to a user through the open software platform. Such an application refers to an application program for providing various kinds of services, for example, a social network service (SNS), finance, news, weather, a map, music, a movie, a game, an electronic book, etc.

However, the concept of the disclosure is not limited to the foregoing embodiments of the display apparatus 100, and thus the display apparatus 100 may be applied to various kinds of examples capable of processing an image, such as a monitor connected to a computer, etc. as well as the TV.

The display apparatus 100 according to an embodiment of the disclosure includes a first circuit board 110, a second circuit board 120, and a display 140. As shown in FIGS. 1 and 2, the second circuit board 120 is installed on the first circuit board 110 and keeps apart at a preset distance of d from the first circuit board 110.

According to an embodiment, the display apparatus 100 further includes a power supply 160, and a driver 150. As shown in FIG. 1, the first circuit board 110 and the power supply 160 are connected by first interfaces 171, and the first circuit board 110 and the driver 150 are connected by second interfaces 172. The first and second interfaces 171 and 172 may be embodied by a plurality of cables through which a signal or power can be transmitted.

According to an embodiment, the display apparatus 100 further includes a chassis 180 provided in the back of the display 140 and configured to hold components including the first circuit board 110.

However, the components of the display apparatus 100 shown in FIGS. 1 and 2 are merely given by way of example, and the display apparatus 100 according to an embodiment of the disclosure may further include another component in addition to those shown in FIG. 1 or exclude some components from those shown in FIG. 1.

The first circuit board 110 refers to a main board (or main substrate or mother board) on which at least one electronic part (or electronic components) 111 is provided to perform a process for displaying an image on the display 140. The electronic parts 111 mounted to or embedded in the first circuit board 110 include a chipset, a memory, etc. and wiring or transmission lines for electrically connecting these electronic parts 111 are provided in the first circuit board 110. According to an embodiment, the first circuit board 110 is embodied by a printed circuit board (PCB).

According to an embodiment, the electronic parts 111 provided in the first circuit board 110 include a tuner to be tuned to a channel for a broadcast signal, and an image processor to process an image signal. The image processor may be embodied by a group of individual components, i.e. electronic parts for individually performing processes to process an image signal, or a main system-on-chip (SoC) where various functions are integrated. The main SoC may further include at least one processor to control general operations of the display apparatus 100 and control signal flow among internal components.

The process performed in the image processor includes decoding for decoding an image signal according to image formats of the display apparatus 100, and scaling for adjusting the image signal to be adapted for the output resolution of the display 140. Here, there are no limits to the kinds of image processing process performed in the image processor according to the exemplary embodiment. For example, the image processing process may perform at least one of various processes such as de-interlacing for converting an interlaced broadcast signal into a progressive broadcast signal, noise reduction for improving image quality, detail enhancement, frame refresh rate conversion, line scanning, etc.

According to an embodiment, a signal generated or synthesized by performing the processes through the electronic parts corresponding to the image processor is output to the display 140 through the driver 150, so that the display 140 can display an image based on the image signal.

The processor loads a control program (or instruction) to implement control operation, and executes the loaded control program. The processor may include at least one of a central processing unit (CPU), a microprocessor, or an application processor (AP). The control program is installed in a nonvolatile memory, i.e. a read only memory (ROM), and at least a part of the installed control program is loaded to a volatile memory, i.e. a random access memory (RAM) and executed. The processor, the ROM, and the RAM are connected to one another through an internal bus.

The processor may include a single-core processor, a dual-core processor, a triple-core processor, a quad-core processor, and the like multiple-core processor. According to an embodiment, the processor may include a plurality of processors, for example, a main processor and a sub processor that operates in a sleep mode, e.g. when the content providing apparatus receives only standby power and does not fully operates.

The control program may include a program(s) achieved in the form of at least one among a basic input/output system (BIOS), a device driver, an operating system, a firmware, a platform, and an application. According to one exemplary embodiment, the application may be previously installed or stored in the display apparatus 100 when the display apparatus 100 is manufactured, or may be installed in the display apparatus 100 for use in the future on the basis of data received corresponding to the application from the outside. The data of the application may for example be downloaded from an external server such as an application market to the display apparatus 100. Such an external server is an example of a computer program product according to an exemplary embodiment, but not limited thereto. Thus, the display apparatus 100 downloads and executes a computer program stored in a separate computer program product, thereby carrying out the operations of the processor.

In the display apparatus 100 of the disclosure, as shown in FIG. 2, the electronic parts 111 corresponding to the image processor and the processor are provided in the first circuit board 110. Of course, this is merely an example, and the electronic parts may be divisionally arranged in a plurality of circuit boards capable of connecting and communicating with each other.

The second circuit board 120 includes at least one antenna (see '123' in FIG. 3) via which a radio frequency (RF) signal is transmitted and received for communication between the display apparatus 100 and the external apparatus. According to an embodiment, the antenna 123 includes a multi-antenna device to transmit and receive an RF signal of 2.4 GHz or 5.0 GHz.

According to an embodiment, the second circuit board 120 (hereinafter, referred to as a sub board) may further include a communication module (see '124' in FIG. 3) to process the RF signal. The communication module 124 may be embodied by electronic parts in the form of a chipset mounted or embedded in the second circuit board 120.

The display apparatus 100 according to an embodiment of the disclosure includes a spacer 130 placed between the first circuit board 110 and the second circuit board 120 and spacing the first circuit board 110 and the second circuit board 120 from each other.

The foregoing display apparatus 100 is designed to have a module on board (MOB) structure in which an antenna assembly including the sub board 120 with the antenna 123 and the spacer 130 is mounted to one surface of the first circuit board, i.e. the main board 110.

A structure for using the spacer 130 to couple the main board 110 and the sub board 120 will be described later in more detail with reference to FIGS. 3 to 8.

A communication module 224 processes an RF signal so that the display apparatus 100 can communicate with the external apparatus, under control of the processor. The communication module 224 may be based on one of various communication methods.

According to an embodiment of the disclosure, the communication module 224 may be configured to allow the display apparatus 100 to perform data communication based on Wi-Fi standards of institute of electrical and electronics engineers (IEEE).

An image signal processed by the electronic part, i.e. the image processor provided in the first circuit board 110 is output to the display 140 through the driver 150. The display 140 includes a display panel to display an image.

There are no limits to the display 140 provided in the external apparatus 200. For example, the display 140 may be actualized by various display types such as liquid crystal, plasma, a light-emitting diode, an organic light-emitting diode (OLED), a surface-conduction electron-emitter, a carbon nano-tube, nano-crystal, etc.

The driver 150 controls the image signal received from the image processor to be displayed as an image on the display 140. According to an embodiment, the driver 150 may be embodied by a control board (or T-con board) with a timing controller (hereinafter, referred to as T-con), which is coupled to an anterior end of the display panel, controls a driver circuitry and enhances image quality. The timing controller generates a control signal to adjust time for which the image is output to the display 140.

The driver 150 includes a driver circuitry provided corresponding to the types of the display 140. For example, when the display 140 is of a liquid crystal type, the driver 150 includes the driver circuitry with at least one driving chip to drive a panel on which an image is displayed.

According to an embodiment, the driver 150 includes a plurality of driving chips, and a control board with a timing controller to generate a control signal for controlling a plurality of driving chips.

The power supply 160 supplies power to the components of the display apparatus 100. The power supply 160 transforms commercial alternating current (AC) power received from the outside into power to be supplied to the components of the display apparatus 100 and supplies the transformed power, and includes an inverter or a switching mode power supply (SMPS). According to an embodiment, the power supply 160 may be embodied by a power board with the SMPS.

The chassis 180 is provided in the back of the display 140 and disposed in parallel with the display 140. The first circuit board 110, the driver 150 and the power supply 160 are fastened and mounted to the chassis 180. Here, the first circuit board 110 may be fastened to the chassis 180, while its surface on which the second circuit board 120 is provided, i.e. an opposite surface to one surface to which the antenna assembly is mounted is facing toward the chassis 180.

According to an embodiment, the chassis 180 is made of aluminum or the like metal, and thus configured to isolate, i.e. shield the display 140 from and against interference caused by components provided opposite the chassis 180.

The display apparatus 100 according to an embodiment of the disclosure has a structure that the second circuit board 120 with the antenna 123 is spaced apart from the chassis 180 or the display 140, thereby improving diffraction characteristics of the RF signal radiated from the antenna 123.

Below, the structure of the antenna assembly including the sub board 120 and the spacer 130 will be described.

Figure 3:
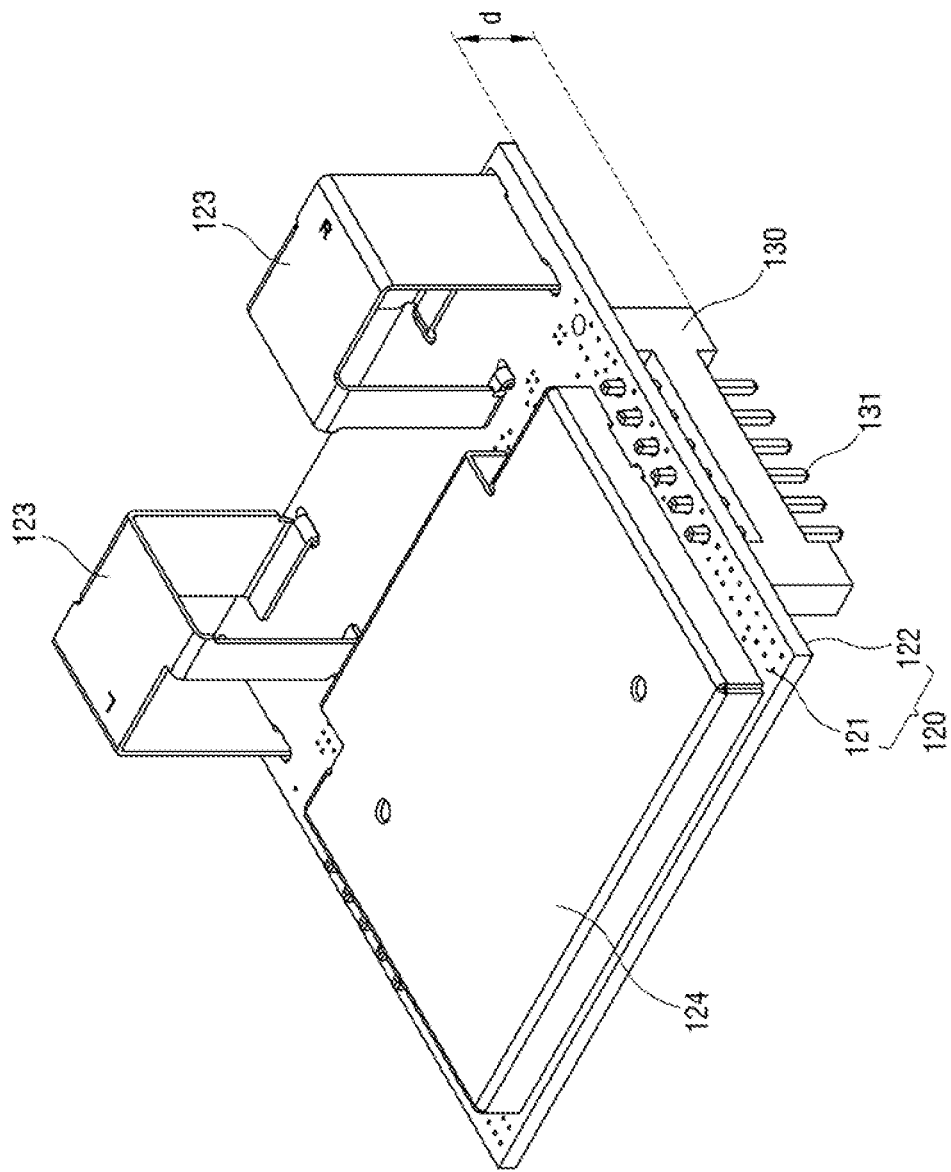
FIGS. 3 and 4 are perspective views of an antenna assembly according to an embodiment of the disclosure.
Figure 4:
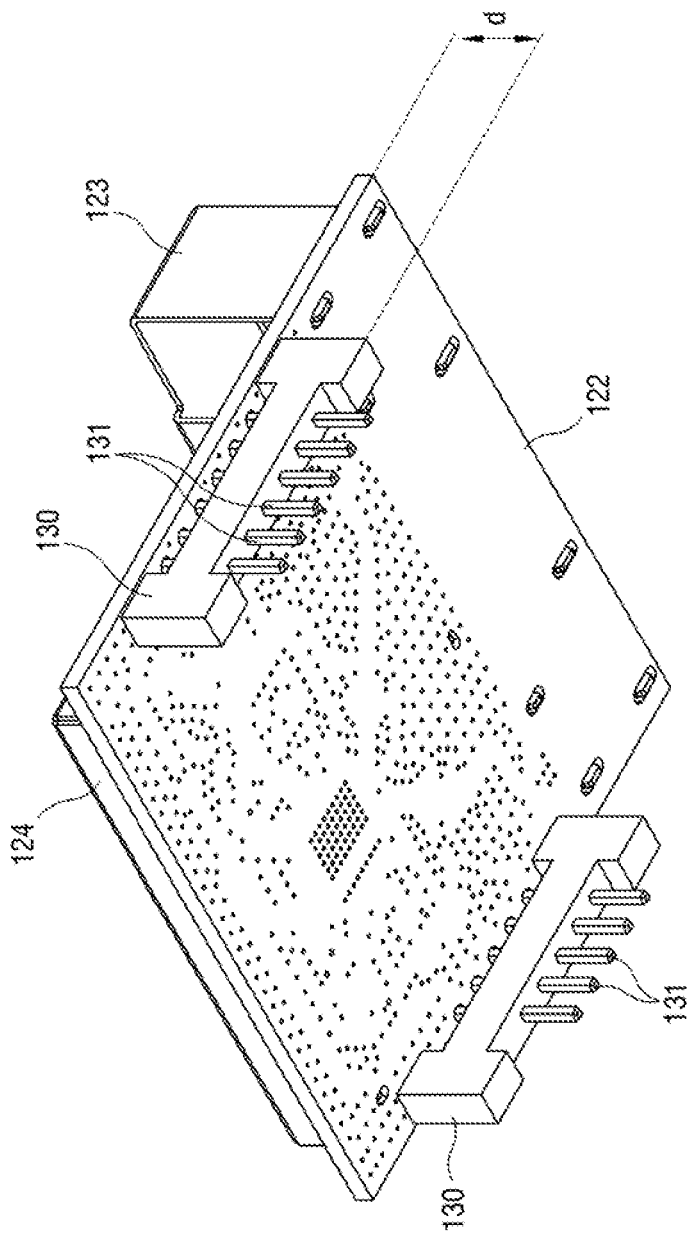
Figure 5:
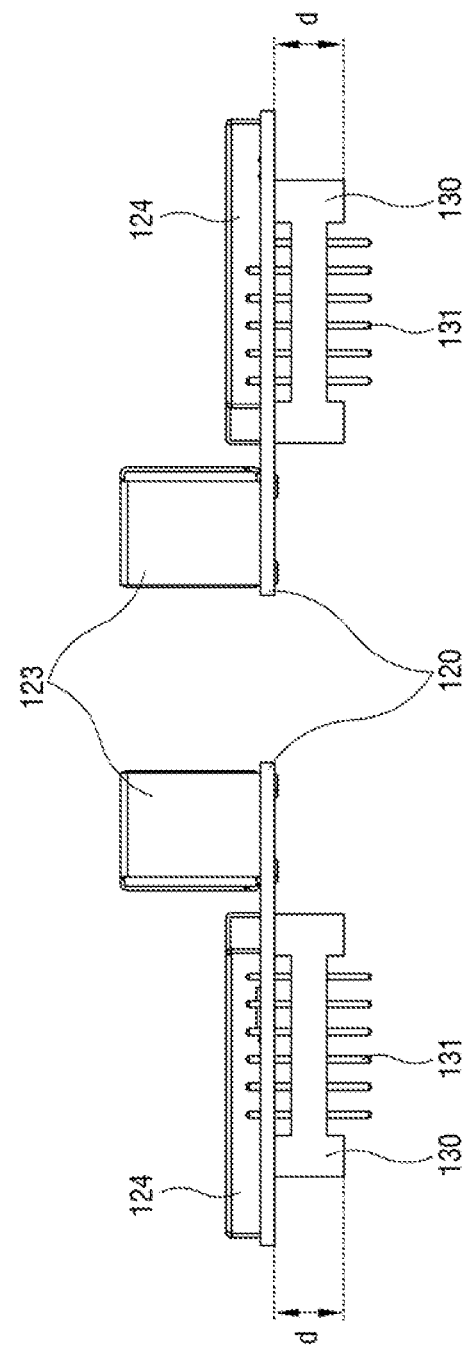
FIG. 5 illustrates the antenna assembly of FIGS. 3 and 4, viewed from lateral sides.
Figure 6:
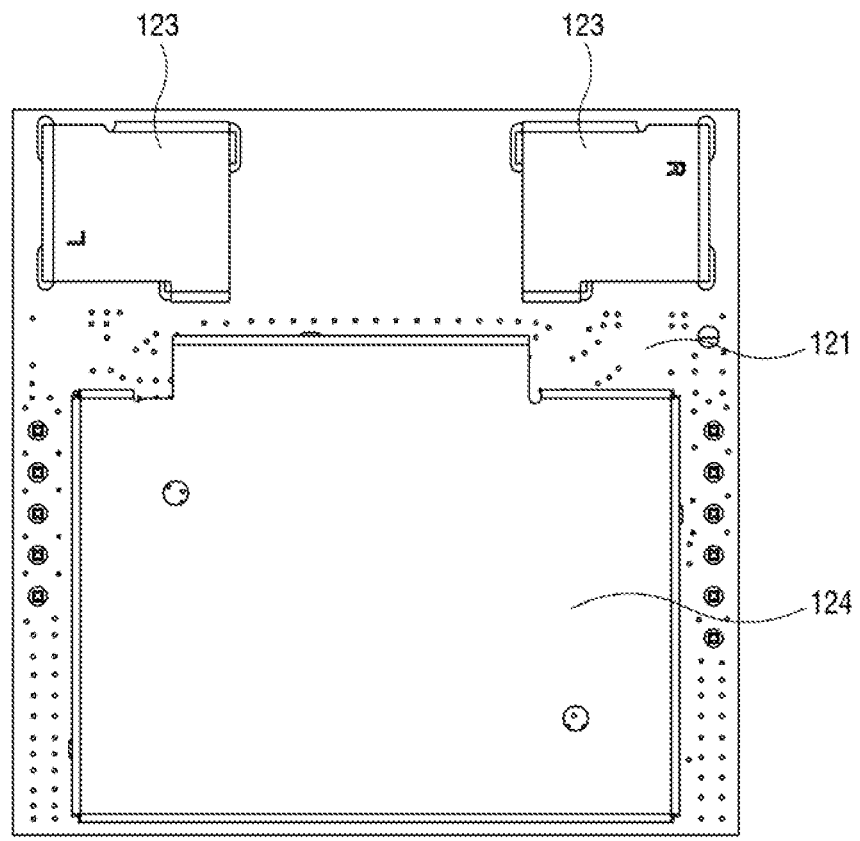
FIG. 6 illustrates the antenna assembly of FIGS. 3 and 4, viewed from a front side.
Figure 7:
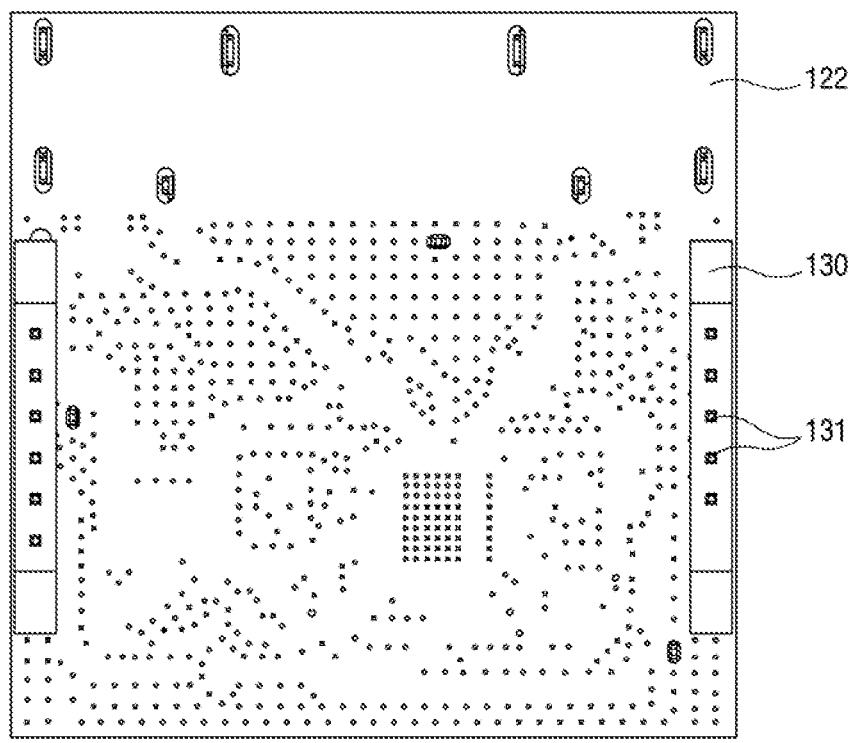
FIG. 7 illustrates the antenna assembly of FIGS. 3 and 4, viewed from a rear side.

FIGS. 3 and 4 are perspective views of an antenna assembly according to an embodiment of the disclosure, FIG. 5 illustrates the antenna assembly of FIGS. 3 and 4, viewed from lateral sides, FIG. 6 illustrates the antenna assembly of FIGS. 3 and 4, viewed from a front side, and FIG. 7 illustrates the antenna assembly of FIGS. 3 and 4, viewed from a rear side.

As shown in FIGS. 3 to 7, at least one antenna 123 is mounted to a first surface 121 of the second circuit board 120. According to an embodiment of the disclosure shown in FIGS. 3 to 7, the communication module 124 is further mounted to the first surface 121.

Referring to FIGS. 1 and 2, a second surface 122 of the second circuit board 120, i.e. the reverse side of the first surface 121 mounted with the antenna 123 is structured to at least partially face toward, i.e. be least partially opposite to the first circuit board 110 with the spacer 130 therebetween.

With this structure, the second circuit board 120 is provided detachably to the first circuit board 110 by the spacer 130.

Here, the first circuit board 110 has an edge region 113 disposed downward in a state that the display apparatus 100 is installed, and the second circuit board 120 is provided in the edge region 113 of the first circuit board 110. Like this, the second circuit board 120 with the antenna 123 is disposed at a downward side of the display apparatus 100, so that the electronic parts 111 of the first circuit board 110 are isolated from effects of a signal radiated from the antenna 123, thereby expecting an effect on improving radiation performance.

According to an embodiment, as shown in FIG. 2, the antenna 123 may be provided on a region of the first surface 121 opposite to a region of the second surface 122 of the second circuit board 120 which is not facing the first circuit board 110. In other words, the antenna 123 is disposed further down than the first circuit board 110, beyond the region of the first circuit board 110. Here, the antenna 123 is installed to keep a predetermined distance from the driver 150 so that the driver 150 can be isolated from effects of a radiated signal.

The spacer 130 forms a pair to be coupled at the opposite edges of the second circuit board 120, and thus serves as a gap member to keep a preset distance d between the first circuit board 110 and the second circuit board 120.

The distance d between the first circuit board 110 and the second circuit board 120 is identified based on an experimental value for securing the radiation performance of the antenna 123, and may for example be 5 mm.

The spacer 130 is provided as an insulator as shown in FIGS. 3 to 5, and includes a housing for supporting the facing sides of the first circuit board 110 and the second circuit board 120. The housing not only supports one surface of the first circuit board 110 to which the electronic parts 111 are mounted, but also supports the second surface 122 of the second circuit board 120.

The spacer 130 is provided in the housing, and includes a plurality of signal transmission pins 131 for transmitting a signal between the first circuit board 110 and the second circuit board 120. The plurality of signal transmission pins 131 is exposed to a first side of the housing and a second side opposite to the first side, and the exposed portions of the signal transmission pins 130 are coupled to both the first circuit board 110 and the second circuit board 120.

The first circuit board 110 and the second circuit board 120 include a plurality of holes into which the exposed portions of the plurality of signal transmission pins 131 are inserted and coupled. For example, the plurality of holes are embodied by internally plated through holes.

In the foregoing display apparatus 100 according to an embodiment of the disclosure, the first circuit board 110 and the second circuit board 120 are electrically connected through the plurality of signal transmission pins 131, so that the processor provided in the first circuit board 110 can control the communication module 124 provided in the second circuit board 120.

Figure 8:
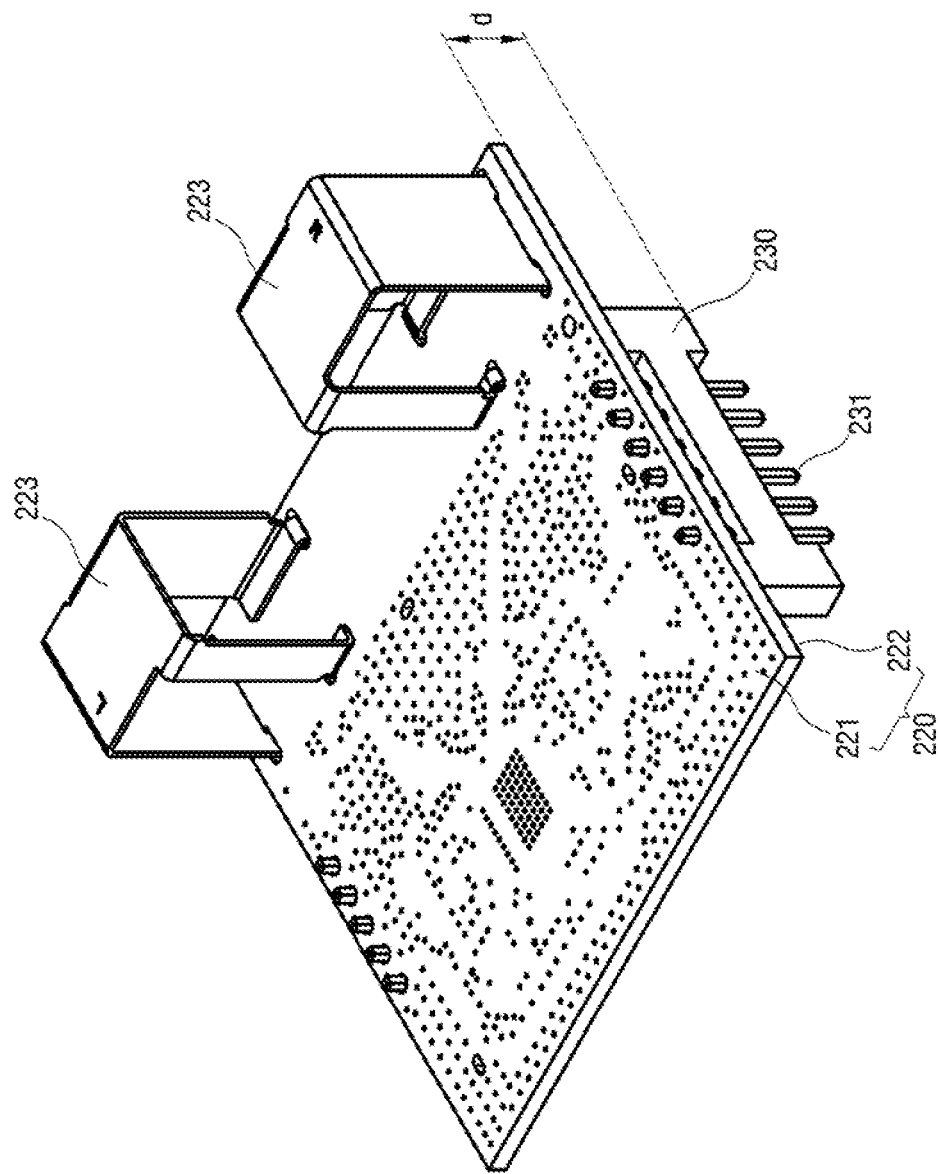
FIG. 8 is a perspective view of an antenna assembly according to another embodiment of the disclosure.

FIG. 8 is a perspective view of an antenna assembly according to another embodiment of the disclosure.

In the antenna assembly according to this embodiment shown in FIG. 8, a communication module is not provided in a second circuit board 220, and only an antenna 223 is mounted to the second circuit board 220 as an electronic part, unlike the embodiment shown in FIGS. 3 to 7.

Therefore, components in the antenna assembly according to this embodiment of the disclosure, which have the same roles or functions as those in the antenna assembly according to the embodiment shown in FIGS. 3 to 7, will be given the same terms, and repetitive descriptions will be omitted.

In this embodiment shown in FIG. 8, the communication module for processing an RF signal transmitted and received through the antenna 223 may be mounted to the first circuit board 110 as the electronic part. The first circuit board 110 and the second circuit board 120 are electrically connected to each other through signal transmission pins 231 of a spacer 230, and therefore the communication module can process the RF signal transmitted and received through the antenna 223.

Figure 9:
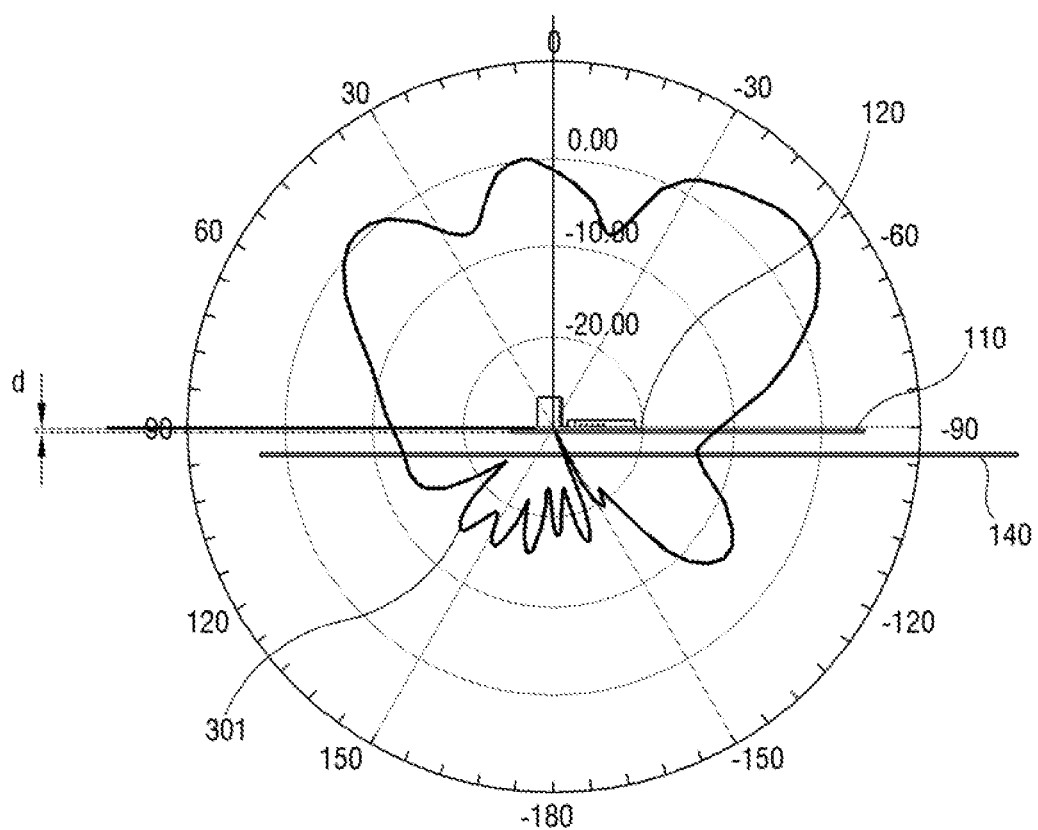
FIGS. 9 and 10 are views for explaining improvement in radiation performance of an antenna in a display apparatus according to an embodiment of the disclosure.
Figure 10:
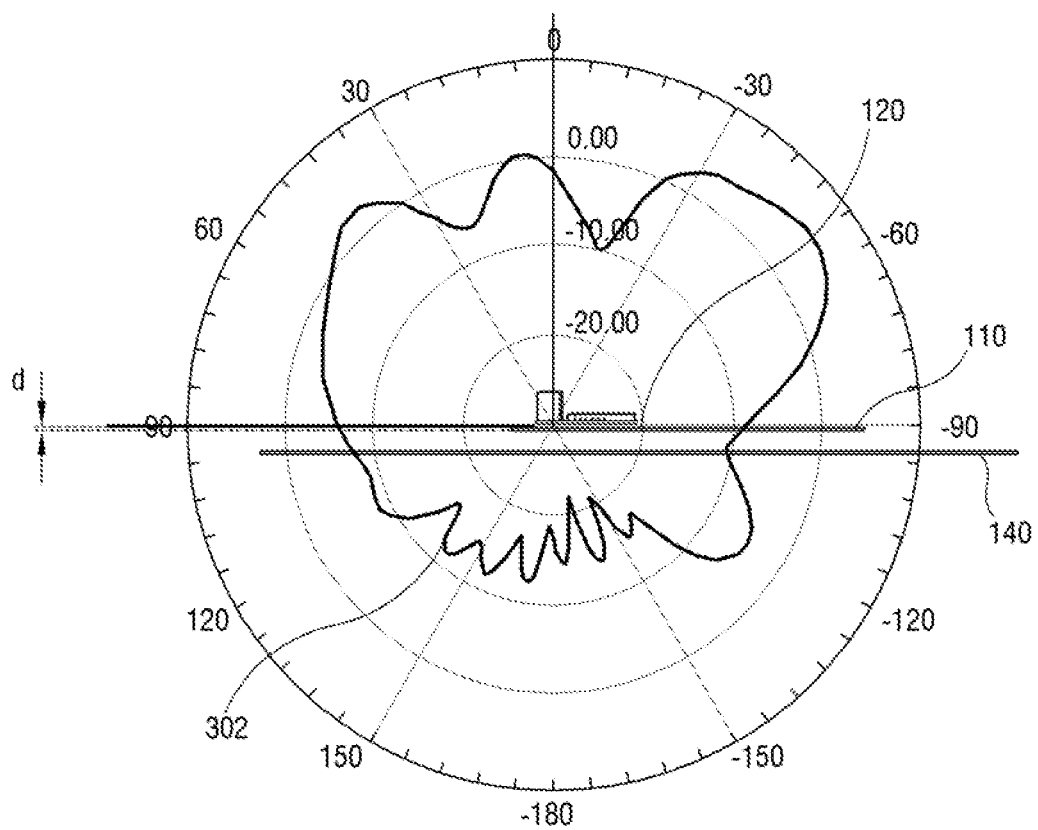

FIGS. 9 and 10 are views for explaining improvement in radiation performance of an antenna in a display apparatus according to an embodiment of the disclosure.

FIG. 9 shows results of measuring antenna efficiencies and isolation of antenna devices when the second circuit board 120 provided with the antenna 123 including the two antenna devices, i.e. the antenna assembly is mounted to the first circuit board 110 without being spaced apart from the first circuit board 110.

FIG. 10 shows results of measuring antenna efficiencies and isolation of antenna devices when the second circuit board 120 provided with the antenna 123 including the two antenna devices, i.e. the antenna assembly is mounted to the first circuit board 110 as being spaced apart at a preset distance d from the first circuit board 110 according to an embodiment of the disclosure.

Referring to FIGS. 9 and 10, when the antenna assembly is spaced apart from the first circuit board 110 like that of FIG. 10, high antenna efficiencies of 70.8% and 69.1% are measured. This may also be confirmed based on that an area 302 of FIG. 10, up to which an antenna signal is distributed frontward, i.e. toward the display 140, is wider than that 301 of FIG. 9 in a state that the display apparatus 100 is installed.

Further, the isolation is improved when the antenna assembly is spaced apart from the first circuit board 110 as shown in FIG. 10, as compared with that shown in FIG. 9. This may also be confirmed based on that an interference signal measured in FIG. 10 has a power level of −6.1 dB lower than that measured in FIG. 9.

As described above, the display apparatus 100 according to an embodiment of the disclosure has a structure that the first circuit board 110 and the second circuit board 120 or 220 are supported being spaced apart at a preset distance d from each other by the housing of the spacer 130 or 230, and the first circuit board 110 and the second circuit board 120 or 220 are electrically connected for signal transmission by the signal transmission pins 131 or 231 exposed to the first and second sides of the housing, thereby improving the efficiency and isolation of the antenna 123 and enhancing the radiation performance.

Further, when the antenna includes a plurality of antenna devices, a signal from one antenna device is likely to radiate up to the main board and affect another antenna device. However, such improvement in the isolation may guarantee multi input multi output (MIMO) characteristics.

Although a few exemplary embodiments have been shown and described, it will be appreciated that changes may be made in these exemplary embodiments without departing from the scope defined in the appended claims.

The invention claimed is:

1. A display apparatus comprising:
   a display;
   a first circuit board comprising at least one electronic part configured to process an image signal for displaying an image on the display;
   a second circuit board comprising at least one antenna configured to transmit and receive a radio frequency (RF) signal for communication between the display apparatus and an external apparatus; and
   a spacer provided between the first circuit board and the second circuit board, and configured to space the first circuit board and the second circuit board apart from each other.

2. The display apparatus according to claim 1, further comprising a communication module provided in the second circuit board and configured to process the RF signal.

3. The display apparatus according to claim 1, further comprising a chassis provided in a back of the display,
   wherein the first circuit board is fastened to the chassis, with a surface, which is opposite to a surface provided with the second circuit board, facing toward the chassis.

4. The display apparatus according to claim 1, wherein the spacer comprises:
   a housing comprising an insulator and configured to support facing surfaces of the first circuit board and the second circuit board; and
   a plurality of signal transmission pins provided in the housing and configured to transmit a signal between the first circuit board and the second circuit board.

5. The display apparatus according to claim 4, wherein the second circuit board is detachably provided in the first circuit board by the spacer,
   the plurality of signal transmission pins is exposed to a first side of the housing and a second side opposite to the first side, and
   the exposed portions of the plurality of signal transmission pins are coupled to both the first circuit board and the second circuit board based on the second circuit board being mounted to the first circuit board.

6. The display apparatus according to claim 1, wherein the first circuit board comprises an edge region disposed downward when the display apparatus is in an installed state, and
   the second circuit board is provided in the edge region of the first circuit board.

7. The display apparatus according to claim 1, wherein the antenna is provided in a first surface of the second circuit board, and
   a second surface of the second circuit board opposite to the first surface at least partially faces toward the first circuit board with the spacer therebetween.

8. The display apparatus according to claim 7, wherein the antenna is provided on a region of the first surface opposite to a region of the second surface of the second circuit board which is not facing the first circuit board.

9. An antenna assembly of a display apparatus, comprising:

a sub board comprising at least one antenna configured to transmit and receive a radio frequency (RF) signal for communication between the display apparatus and an external apparatus; and a spacer provided between a main board provided with at least one electronic part to process an image signal for displaying an image on the display apparatus and the sub board, and configured to space the main board and the sub board apart from each other.

10. The antenna assembly according to claim 9, further comprising a communication module provided in the sub board and configured to process the RF signal.

11. The antenna assembly according to claim 9, wherein the spacer comprises:
   a housing comprising an insulator and configured to support facing surfaces of the main board and the sub board; and
   a plurality of signal transmission pins provided in the housing and configured to transmit a signal between the main board and the sub board.

12. The antenna assembly according to claim 11, wherein the sub board is detachably provided in the first circuit board by the spacer, the plurality of signal transmission pins is exposed to a first side of the housing and a second side opposite to the first side, and the exposed portions of the plurality of signal transmission pins are coupled to both the main board and the sub board based on the sub board being mounted to the main board.

13. The antenna assembly according to claim 9, wherein the main board comprises an edge region disposed downward when the display apparatus is in an installed state, and the sub board is provided in the edge region of the main board.

14. The antenna assembly according to claim 9, wherein the antenna is provided in a first surface of the sub board, and a second surface of the second circuit board opposite to the first surface at least partially faces toward the first circuit board with the spacer therebetween.

15. The antenna assembly according to claim 14, wherein the antenna is provided on a region of the first surface opposite to a region of the second surface of the second circuit board which is not facing the first circuit board.

* * * * *